United States Patent
Wheeler et al.

(10) Patent No.: US 7,016,826 B2
(45) Date of Patent: Mar. 21, 2006

(54) APPARATUS AND METHOD OF DEVELOPING SOFTWARE FOR A MULTI-PROCESSOR CHIP

(75) Inventors: William R. Wheeler, Southborough, MA (US); Lai-Wah Hui, Holliston, MA (US); Donald F. Hooper, Shrewsbury, MA (US); Serge Kornfeld, Westboro, MA (US); James D. Guilford, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 1007 days.

(21) Appl. No.: 09/745,561

(22) Filed: Dec. 21, 2000

(65) Prior Publication Data

US 2002/0083112 A1 Jun. 27, 2002

(51) Int. Cl.
*G06F 17/50* (2006.01)
*G06F 9/455* (2006.01)

(52) U.S. Cl. ............................ 703/19; 703/20; 703/24; 703/28

(58) Field of Classification Search ................. 703/24, 703/19–20, 21, 28; 395/500, 551, 559
See application file for complete search history.

(56) References Cited

U.S. PATENT DOCUMENTS

| | | | | |
|---|---|---|---|---|
| 5,838,948 A | * | 11/1998 | Bunza | 703/27 |
| 5,953,516 A | * | 9/1999 | Bonola | 703/24 |
| 5,999,734 A | * | 12/1999 | Willis et al. | 717/149 |
| 6,028,996 A | * | 2/2000 | Sniderman et al. | 703/28 |
| 6,052,524 A | * | 4/2000 | Pauna | 703/22 |
| 6,321,279 B1 | * | 11/2001 | Bonola | 710/36 |
| 6,427,224 B1 | * | 7/2002 | Devins et al. | 716/4 |
| 6,571,373 B1 | * | 5/2003 | Devins et al. | 716/5 |
| 6,678,645 B1 | * | 1/2004 | Rajsuman et al. | 703/20 |

* cited by examiner

*Primary Examiner*—Hugh Jones
(74) *Attorney, Agent, or Firm*—Fish & Richardson P.C.

(57) ABSTRACT

Applications software can be rapidly tested and developed for a multi-processor chip even though the hardware of new processors of the multi-processor chip is not yet available. This can be accomplished by executing software simulations of the new processor designs and corresponding applications software either on a previously designed processor that is hardware on the multi-processor chip or on a workstation development platform. The execution of the previously designed processor is typically much faster than the execution on a simulator running on a personal workstation development platform, and therefore the execution time is quicker. Furthermore, the processor simulation and application software can be configured to take advantage of the platform most appropriate for execution and avoid simulation of portions of the new processors that are not necessary for testing the applications software.

15 Claims, 2 Drawing Sheets

APPARATUS AND METHOD OF DEVELOPING SOFTWARE FOR A MULTI-PROCESSOR CHIP

BACKGROUND OF THE INVENTION

1. Field of the Invention

The present invention relates generally to the field of digital data processing systems and, more particularly, to an apparatus and method of developing applications software for a multi-processor chip.

2. Background

The apparatus and method of developing software for a multi-processor chip provides a solution to developing applications software for a new multi-processor chip design, with fast simulation.

Conventional development of applications software for a new processor chip requires a software simulation model of the entire new chip design, and then the applications software is run on the model of the chip. Simulation in this way may be slow, due to the sheer quantity of design states that must be modeled for the chip.

As integrated circuit geometries scale with process technology, more area becomes available on a chip for new functions. New multi-processor chip designs are beginning to integrate processor designs from previous production processor chips, where a previous production processor is essentially lifted and inserted into a corner of the new multi-processor chip. The previous processors have highly detailed simulation models, such as a detailed gate-level model. Because the simulation models are highly detailed, the processor simulation models are highly computationally intensive and therefore relatively slow to run.

Newer processor designs are known that have two simulation models. One version of the simulation model is the previously described detailed simulation model. The other version is a high-level, fast, cycle-accurate model. By simulating with the high-level model, high-speed simulation of the chip designs can be achieved.

When new multi-processor chips are designed that use previously designed processors and newer processors on one chip, high-speed simulation of the entire multi-processor chip may not be achieved because no high-speed simulation model exists for the previous processors. This causes a bottleneck in the development of the applications software.

Further, because the new multi-processor chips contain multiple processors, communications need to be tested between the processors, which involve interrupt and signaling mechanisms. The previous design chip sections do not have this hardware.

Another problem is simulation of memory access. Initialization of tables in memory can take as long as forty-five minutes. A need exists to circumvent this startup delay for most tests.

A need therefore exists for a solution to develop and test applications software on a new multi-processor chip design that uses previous processors and newer processors, with fast simulation and minimal resources expended to create the simulation model. Furthermore, the solution should provide a way to test communications between processors and fast simulation of memory access.

DESCRIPTION OF THE PREFERRED EMBODIMENTS

The present invention, which tends to address this need, resides in an apparatus and method of developing applications software for a multi-processor chip. The apparatus and method described herein provides advantages over known solutions to develop and test applications software for a multi-processor chip design in that it provides fast simulation and minimal resources expended to create the simulation model of the chip design. Furthermore, the apparatus and method provides a way to test communications between processors, fast simulation of memory access, and easy configuration to test selected applications software.

According to the present invention, applications software can be rapidly tested and developed for a multi-processor chip. This can be accomplished by executing software simulations of the new processors and applications software on a previously designed processor that is part of the hardware on the multi-processor chip. The previously designed processor does not need to be simulated as part of the multi-chip simulation, which may speed up the simulation. The previously designed processor is typically much faster than those found on a personal workstation development platform, and therefore the execution time is faster. The processor simulation and application software can be configured to take advantage of the configuration most appropriate for fast execution, and avoid simulation of portions of the new processors not necessary for testing the applications software. The second processor corresponding to the applications software being debugged can be set in slow simulation mode while the other second processors can be set in fast simulation mode.

Thus, the software can be developed with fast simulation and minimal resources. Furthermore, the apparatus and method provides a way to test communications between processors, fast simulation of memory access, and easy configuration to test selected applications software.

Figure 1:
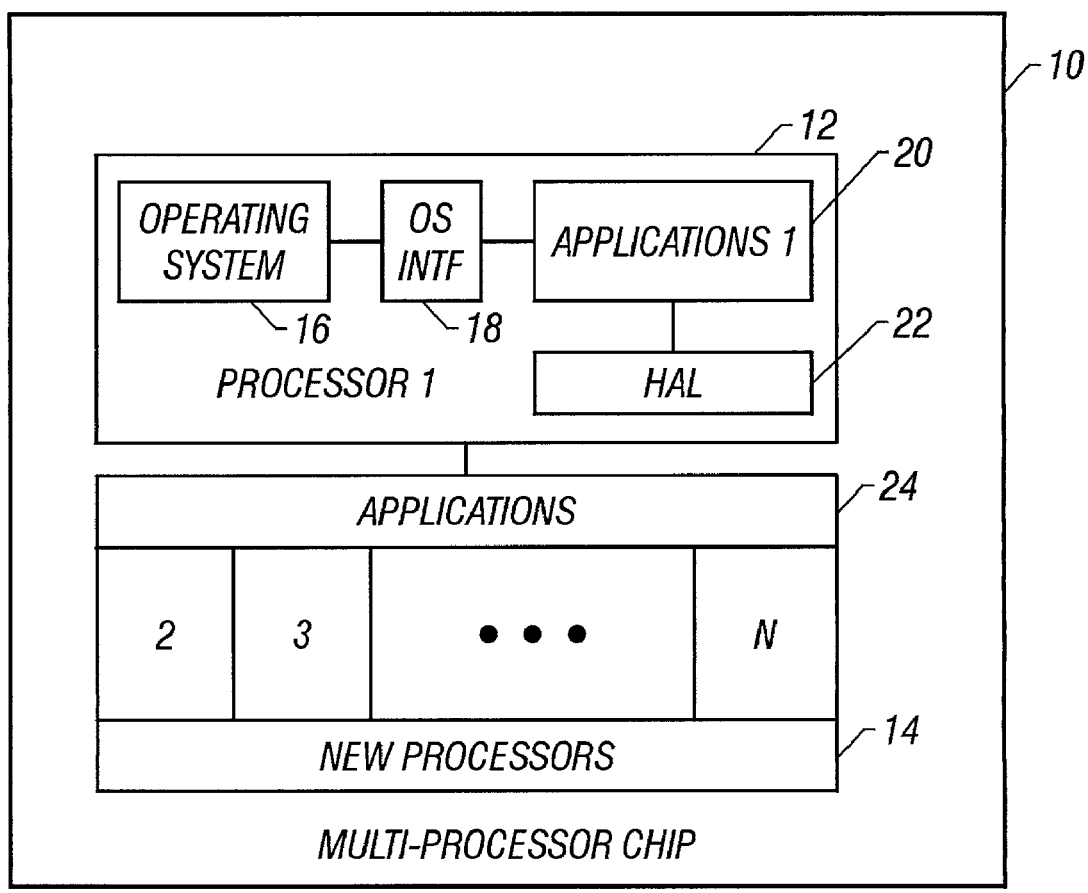
FIG. 1 is a block diagram of a full hardware configuration of a multi-processor chip configured according to the present invention.

FIG. 1 illustrates a full hardware configuration of a multi-processor chip 10 configured according to the present invention. Ultimately, a multi-processor chip under development will have processors 1 through N, including processor 1 (12) and processors 2 through N (14), in hardware on a single silicon chip. According to the present invention, one of these processors 12 can be a previously designed, production processor, such as, the StrongARM™ brand processor available from Intel, Inc. The other processors 14 can be newly designed processors that are part of the hardware on the single silicon chip. In an embodiment, the multi-processor chip is designed for internetworking applications, but a skilled artisan will recognize that other applications may employed according to the invention.

The first processor 12 has an embedded operating system 16 that will run on the production chip, such as, VXWORKS, UCOS, PSOS, OS9, or LINUX. Furthermore, first processor 12 includes an operating system interface 18, which interfaces with a first applications software 20.

Applications software 1 through N, including applications software 1 (20) and applications software 2 through N (24), can be applications software that execute on processors 1 through N, respectively. The first applications software 20 executes on the first processor 12 and has procedures that communicate with other portions of the multi-chip processor. Furthermore, the first applications software 20 interfaces to the rest of the chip through a hardware abstraction layer (HAL) 22, which is a set of function calls.

Applications software 2 through N (24) run on processors 2 through N (14), respectively. In an embodiment, applications software 2 through N can be programs to perform processing of packets or frames in Frame Relay and Ethernet applications.

According to the present invention, a variety of configurations for the operating system, the processor simulation, and the applications software are available to facilitate the development of the applications software for the multi-processor chip.

Figure 2:
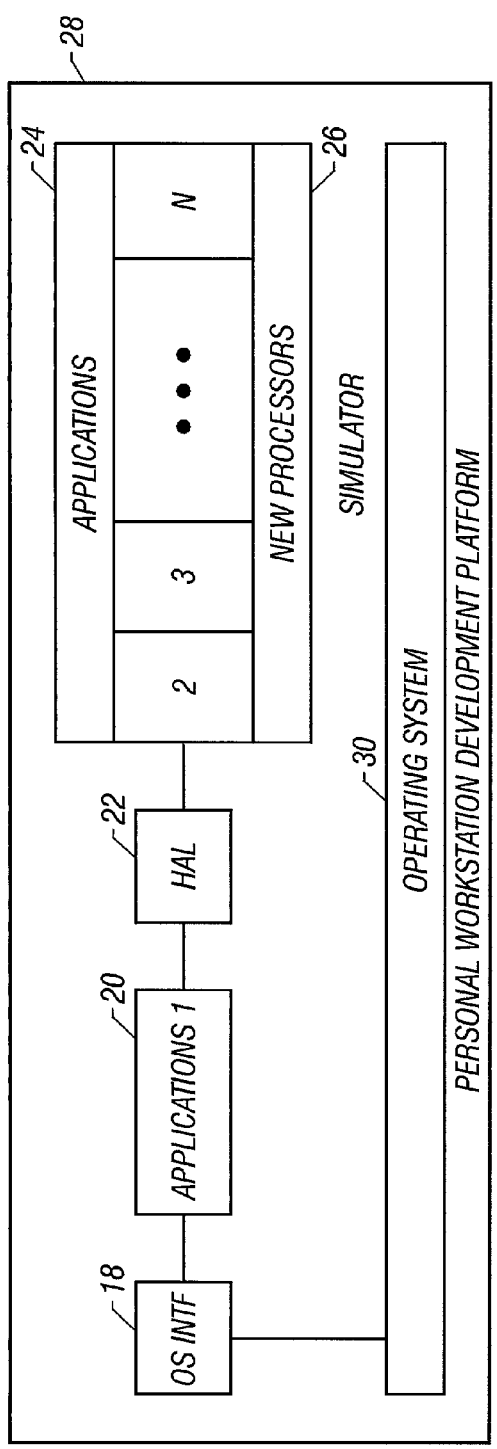
FIG. 2 is a block diagram of a full software configuration of the multi-processor chip configured according to the present invention.

For example, FIG. 2 is a block diagram of a full software configuration of the multi-processor chip 10 configured according to the present invention. Software simulations 26 of one or more second processors 14 that are to be provided in hardware on the single silicon chip are loaded on a personal workstation development platform 28. One or more applications software 24 that are to be executed on the hardware 14 of the corresponding second processors also are loaded on the platform. The software simulations of the second processors and the corresponding applications software are executed on the workstation platform using the processor and operating system 30 of the workstation.

In the full software simulation configuration, the simulation runs on a different operating system than the embedded operating system 16 of the first processor 12. For example, the non-embedded operating system can be Microsoft Windows NT. Windows NT may be preferred because of the convenience of the NT development platform.

The operating system interface 18 provides a simple generic interface to first applications software 20, while translating the system calls to those of the non-embedded operating system 30. Furthermore, the operating system interface simulates interrupts from the second processor simulations 26 to the first processor, thus providing a way to test communications between the processors.

The applications software 24 includes an interface that allows software to be configured to execute on either the hardware of the second processor 14 or to execute with the simulation of the second processor 26. In addition, each software simulation includes a slow, highly detailed software simulation of the second processor and a fast, high-level simulation of the second processor. The interface additionally allows the software simulation to be selected as either the slow, highly detailed software simulation or the fast, high-level simulation.

In the slow, highly detailed software simulation, the first applications software 20 communicates through a simulation of the intra-chip bus interface, which is part of the processor simulation 26, to the second processor simulation 26 and to memory and control status registers. In the fast, high-level simulation, the bus interface is bypassed. This latter mode may be used to perform fast accesses and large array accesses in the simulator.

This configuration can also be advantageously used to test the portable language portions of first applications software 20.

Figure 3:
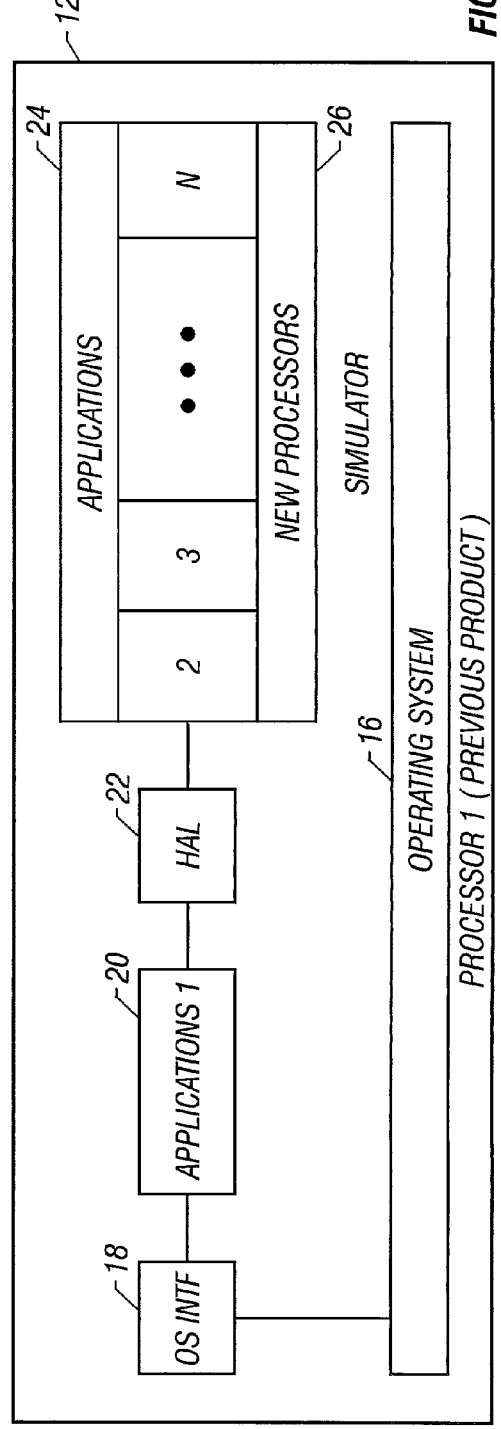
FIG. 3 is a block diagram of a partial hardware configuration the multi-processor chip configured according to the present invention.

Another example of the variety of possible configurations to develop the applications software is illustrated in FIG. 3. FIG. 3 is a block diagram of a partial hardware configuration of the multi-processor chip configured according to the present invention. In the partial hardware configuration, the applications software 20, 24 and software simulations 26 are executed on first processor 12, which is provided as hardware on the single silicon chip 10. The software simulations of one or more second processors that are to be provided in hardware on the single silicon chip are loaded on the first processor. One or more applications software 24 that are to be executed on the hardware of the corresponding second processors also are loaded on the first processor.

The applications software 24 includes an interface that allows the software to be configured to execute on either the hardware of the second processor or to execute with the simulation of the second processor on the first processor 12. In addition, the software simulation of the second processor includes a slow, highly detailed software simulation of the second processor and a fast, high-level simulation of the second processor. The interface additionally allows the software simulation to be selected as either the slow, highly detailed software simulation or the fast, high-level simulation.

This configuration provides the advantage of being able to test and develop the applications software using the actual hardware of the first processor and the embedded operating system, and thus avoid the slow simulation of the first processor and reduce the number of ancillary bugs. Further, this configuration uses the high-processing speed of the first processor as opposed to a slower workstation platform.

Further, only the second processor corresponding to the applications software being debugged needs to be set in slow simulation mode while the other second processors can be set in fast simulation mode. This too results in faster execution times of the simulation.

As hardware becomes available for the second processors, the interface of the corresponding applications software can be configured to run on the hardware, thus improving the speed of processing by avoiding the slower software simulation of the second processor.

This configuration can also be advantageously used to test the non-portable language portions of the first applications software.

In conclusion, the apparatus and method of developing software described herein provides advantages over known solutions to develop and test applications software for a multi-processor chip design in that it provides fast simulation and minimal resources expended to create the simulation model of the chip design. Furthermore, the apparatus and method provides a way to test communications between processors, fast simulation of memory access, and easy configuration to test selected applications software. This is primarily accomplished by utilizing the speed of a previously designed high-speed processor to run the simulations of new processor designs and applications software and utilizing the high-speed and low-speed simulation of the new processor designs where appropriate.

Those skilled in the art will recognize that other modifications and variations can be made the method of developing software of the present invention without departing from the scope or spirit of this invention.

REFERENCE NUMERALS

10 multi-processor chip
12 first processor
14 second processor (hardware)
16 embedded operating system
18 operating system interface
20 first applications software
22 hardware abstraction layer 24 applications software 2–N
26 software simulatons
28 personal workstation development platform
30 non-embedded operating system

What is claimed is:

1. A method comprising:
providing a first processor on a single silicon chip;
loading, on the first processor, a plurality of software simulations of a corresponding plurality of second processors that are to be provided in hardware on the single silicon chip;
loading, on the first processor, a plurality of software applications, where one of the software applications is configured to be executed on the hardware of one of the second processors and is executed with a corresponding software simulation of the second processor on the first processor to debug the one of the software applications; and
setting the corresponding software simulation, that is executing the one of the software applications being debugged, to a first simulation mode, and setting at least one other software simulation that is executing a different one of the software applications, which is not being debugged, to a second simulation mode.

2. The method of claim 1:
wherein the corresponding software simulation of the corresponding second processor includes a slow, highly detailed simulation of the second processor and a fast, high-level simulation of the second processor;
and setting a software simulation to either the first simulation mode or the second simulation mode comprises selecting the software simulation as either the slow, highly detailed simulation or the fast, high-level simulation.

3. The method of claim 2 wherein the slow, highly detailed simulation of the second processor includes a simulation of bus interface to the second processor and to memory and control status registers.

4. A method comprising:
providing a first processor on a single silicon chip;
loading, on the first processor, a software simulation of a second processor that is to be provided in hardware on the single silicon chip;
loading, on the first processor, a software application to be executed on the hardware of the second processor;
executing the software simulation of the second processor and the software application on the first processor;
providing a third processor external to the single silicon chip;
wherein the software simulation of the second processor includes a first interface;
configuring the first interface to execute the software simulation of the second processor on the third processor;
loading, on the third processor, the software simulation of the second processor;
wherein the software application includes a second interface;
configuring the second interface to execute the software application on the third processor;
loading, on the third processor, the software application; and
executing the software simulation of the second processor and the software application on the third processor.

5. The method of claim 1 further comprising:
providing at least one of the second processors as hardware on the single silicon chip;
wherein each of the software applications includes an interface;
for at least one of the software applications, configuring the interface to execute the software applications on the hardware of the corresponding second processor; and
executing the software applications on the hardware of the corresponding second processor.

6. A computer program product embodied on a tangible storage medium, the program comprising executable instructions that enable the computer to:
configure a software simulation of a first processor, which is to be provided in hardware on a single silicon chip, to execute on a second processor on the single silicon chip;
configure a first software application, which is to be executed on the hardware of the first processor, to execute with the software simulation of the first processor on the second processor or to execute on the hardware of the first processor; and
set the software simulation of the first processor in either a slow, highly detailed simulation mode or a fast, high-level simulation mode based on whether the first software application is being debugged, if the first software application is configured to execute with the software simulation of the first processor.

7. The computer program product embodied on a tangible storage medium of claim 6, the program further comprising executable instructions that enable the computer to:
configure a second software application to execute on either the second processor or a processor external to the single silicon chip.

8. A method of developing software for a multi-processor chip, the method comprising:
loading, on a first processor, a plurality of software simulations of a plurality of second processors that are to be provided in hardware on a single silicon chip, each software simulation corresponding to a one of the second processors, and each software simulation including a slow, highly detailed simulation of the second processor and a fast, high-level simulation of the second processor;
selecting each software simulation as either the slow, highly detailed simulation or the fast, high-level simulation;
loading, on the first processor, a plurality of software applications, each software application to be executed on the hardware of a corresponding one of the plurality of second processors; and
executing the plurality of software simulations of the plurality of second processors and the plurality of software applications on the first processor.

9. The method of claim 8 wherein the slow, highly detailed simulation of the second processor includes a simulation of bus interface to the first processor and to memory and control status registers.

10. The method of claim 8 further comprising providing the first processor as hardware on the single silicon chip.

11. The method of claim 8 further comprising providing the first processor as hardware external to the single silicon chip.

12. The method of claim 8 further comprising:
providing a one of the plurality of second processors as hardware on the single silicon chip;
wherein each of the plurality of software applications includes an interface;
configuring the interface of the software application corresponding to the one of the plurality of the second processors to execute the software application corresponding to the one of the plurality of the second processors on the hardware of the one of the plurality of second processors; and executing the software application on the hardware of the second processor.

13. An apparatus for developing software for a multi-processor chip comprising:

a first processor on a single silicon chip having loaded thereon, a plurality of software simulations of a corresponding plurality of second processors that are to be provided in hardware on the single silicon chip, and a plurality of software applications, where one of the software application is configured to be executed on the hardware of one of the second processors and is executed with a corresponding software simulation of the second processor on the first processor to debug the one of the software applications;

wherein the first processor is configured to execute the software application being debugged with a software simulation set to a first simulation mode, and to execute at least one other of the software applications not being debugged with a software simulation set to a second simulation mode.

14. The apparatus of claim 13 further comprising:

a third processor external to the single silicon chip having loaded thereon the software simulation of at least one of the second processors and the corresponding software application;

the third processor configured to execute the software simulation of the second processor and the software application.

15. The apparatus of claim 13 wherein each software simulation of a corresponding second processor includes a slow, highly detailed simulation of the second processor and a fast, high-level simulation of the second processor;

and the first simulation mode comprises the slow, highly detailed simulation, and the second simulation mode comprises the fast, high-level simulation.

* * * * *